(12) United States Patent
Sasaki et al.

(10) Patent No.: US 7,414,398 B2
(45) Date of Patent: Aug. 19, 2008

(54) MAGNETIC DETECTION DEVICE HAVING MAGNETIC DETECTION ELEMENT IN MAGNETIC DETECTION CIRCUIT AND FABRICATING METHOD THEREOF

(75) Inventors: Yoshito Sasaki, Niigata-ken (JP); Hideki Gochou, Niigata-ken (JP); Kiyoshi Sato, Niigata-ken (JP)

(73) Assignee: Alps Electric Co., Ltd, Tokyo (JP)

( * ) Notice: Subject to any disclaimer, the term of this patent is extended or adjusted under 35 U.S.C. 154(b) by 0 days.

(21) Appl. No.: 11/692,823

(22) Filed: Mar. 28, 2007

(65) Prior Publication Data
US 2007/0229068 A1 Oct. 4, 2007

(30) Foreign Application Priority Data
Mar. 30, 2006 (JP) ............................... 2006-094290

(51) Int. Cl.
*G01R 33/02* (2006.01)
(52) U.S. Cl. .............. 324/252; 324/207.21; 324/207.15
(58) Field of Classification Search ............ 324/207.21, 324/252, 249, 207.15, 207.25, 207.2, 251; 338/32 R, 32 H
See application file for complete search history.

(56) References Cited

U.S. PATENT DOCUMENTS 6,891,368 B2 * 5/2005 Kawano et al. ............. 324/252
7,170,287 B2 * 1/2007 Kobayashi et al. .......... 324/252

FOREIGN PATENT DOCUMENTS

JP       A1 8-279326       10/1996

* cited by examiner

*Primary Examiner*—Reena Aurora
(74) *Attorney, Agent, or Firm*—Brinks Hofer Gilson & Lione

(57) ABSTRACT

A magnetic detection device of which an output can be completely switched over with an external magnetic field is formed in a small size. A detection circuit is formed by forming circuit elements such as an active element layer and interconnection layers on a substrate. An insulating layer is formed on the detection circuit, and a flat surface is formed on the resultant surface. A magnetic detection element that detects an external magnetic field by using a magneto-resistance effect and a fixed resistance element, which has the same electric resistance as the magnetic detection element but does not react to the external magnetic field, are formed on the flat surface. Electrode layers and a lead layer are formed on the flat surface, and the lead layer and the interconnection layer are electrically connected to each other via a bump penetrating the insulating layer. The magnetic detection element and the fixed resistance element are formed on the flat surface of the insulating layer, thereby forming a small magnetic detection device.

8 Claims, 4 Drawing Sheets

MAGNETIC DETECTION DEVICE HAVING MAGNETIC DETECTION ELEMENT IN MAGNETIC DETECTION CIRCUIT AND FABRICATING METHOD THEREOF

CLAIM OF PRIORITY

This application claims benefit of the Japanese Patent Application No. 2006-094290 filed on Mar. 30, 2006, which is hereby incorporated by reference.

BACKGROUND

1. Field of the Invention

The present invention relates to a magnetic detection device and a fabrication method thereof, and more particularly, to a magnetic detection device including a magnetic detection element, which detects an external magnetic field, and a detection circuit that detects an electrical resistance of the magnetic detection element.

2. Description of the Related Art

A magnetic detection device that detects an external magnetic field is used for a non-contact ON-OFF switch, a rotary encoder that detects a phase of rotation or the number of rotations, and the like. A known magnetic detection device mainly uses a hall element as a magnetic detection element. However, a magnetic detection device using a hall element has a disadvantage in that a circuit configuration of the detection circuit is complex because a correction circuit is necessary for a detection output. A magnetic detection element using a magneto-resistance effect has an advantage in that the circuit configuration of the detection circuit can be relatively simple and can detect the external magnetic field with high precision.

The invention related to a hybrid IC of which a magnetic conversion IC chip integrating the hall element, a magnetic conversion element, or the like and other circuit components disposed on a substrate is disclosed in a Patent Document 1 (Japanese Unexamined Patent Application Publication No. 8-279326).

Although it is described in the above-mentioned Patent Document 1 that the hall element, the magneto-resistance element, or the like is integrated in the magnetic conversion IC chip, its integrated structure is not clearly described. When the IC chip is fabricated by two-dimensionally arranging a circuit having a magnetic conversion element on a substrate, only the IC chip itself is relatively large. Additionally, because the hybrid IC described in the patent document 1 has the magnetic conversion IC chip and other circuit components two-dimensionally arranged on the same substrate, an area of an integrated circuit having the magnetic conversion element and a process circuit thereof becomes larger. Therefore, it is not appropriate to mount the integrated circuit on a small device. Also, even when it is mounted on something other than the small device, a space for disposing other component or a mechanism is limited because the space for forming the integrated circuit is required to be large.

BRIEF SUMMARY

According to a first aspect, there is provided a magnetic detection device including a magnetic detection element with a multi-layered film structure in which an electric resistance varies with an external magnetic field using a magneto-resistance effect and a detection circuit detecting a variation in electric resistance of the magnetic detection element. An active element and an interconnection layer included in the detection circuit are disposed on a substrate. At least a portion on the surface of an insulating layer covering the active element layer and the interconnection layer is planarized into a flat surface. The magnetic detection element is disposed on the flat surface, and the interconnection layer on the substrate and the magnetic detection element on the insulating layer are electrically connected to each other.

According to a second aspect, a fixed resistance element is of the same film as the magnetic detection element and an electric resistance thereof does not vary with the external magnetic field. The fixed resistance element and the magnetic detection element are connected to each other in series and disposed on the flat surface, and a connection point between the magnetic detection element and the fixed resistance element is electrically connected to the interconnection layer.

According to a third aspect, an electrode layer of the magnetic detection element or a lead layer extending from the electrode layer that is disposed on the flat surface is disposed above the interconnection layer, and the electrode layer or the lead layer and the interconnection layer, which are disposed above and below each other, are electrically connected to each other.

According to a fourth aspect, a bridge circuit includes the magnetic detection element. A reference resistance element included in the bridge circuit is disposed on the substrate together with the active element.

According to a fifth aspect, there is provided a method of fabricating a magnetic detection device that includes a magnetic detection element with a multi-layered film structure of which an electric resistance varies with an external magnetic field using a magneto-resistance effect. The magnetic detection device also includes a detection circuit that detects a variation in electric resistance of the magnetic detection element. An active element and an interconnection layer included in the detection circuit are formed on a substrate. At least a portion of the surface of an insulating layer covering the active element and the interconnection layer is planarized into a flat surface. The magnetic detection element is formed on the flat surface. The interconnection layer on the substrate and the magnetic detection element are electrically connected to each other on the insulating layer.

According to a sixth aspect, a fixed resistance element that is formed of the same film as the magnetic detection element and of which electric resistance does not vary with the external magnetic field is formed to be electrically connected in series to the magnetic detection element on the flat surface. A connection point between the magnetic detection element and the fixed resistance element is electrically connected to the interconnection layer.

According to a seventh aspect, an electrode layer of the magnetic detection element is formed on the flat surface, the electrode layer or a lead layer extending from the electrode layer is formed just above the interconnection layer, and the electrode layer or the lead layer and the interconnection layer, which are disposed above and below each other, are electrically connected to each other.

According to an eighth aspect, a bridge circuit having the magnetic detection element is formed. A reference resistance element included in the bridge circuit is formed on the substrate together with the active element.

Other systems, methods features, and advantages of the invention will be, or will become, apparent to one with skill in the art upon examination of the following figures and detailed description. It is intended that all such additional systems, methods, features, and advantages be included within this description.

BRIEF DESCRIPTION OF THE DRAWINGS

The components in the figures are not necessarily to scale, emphasis instead being placed upon illustrating the principles of the invention. Moreover, in the figures, like referenced numerals designate corresponding parts throughout the different views.

DESCRIPTION OF THE PREFERRED EMBODIMENTS

Figure 1:
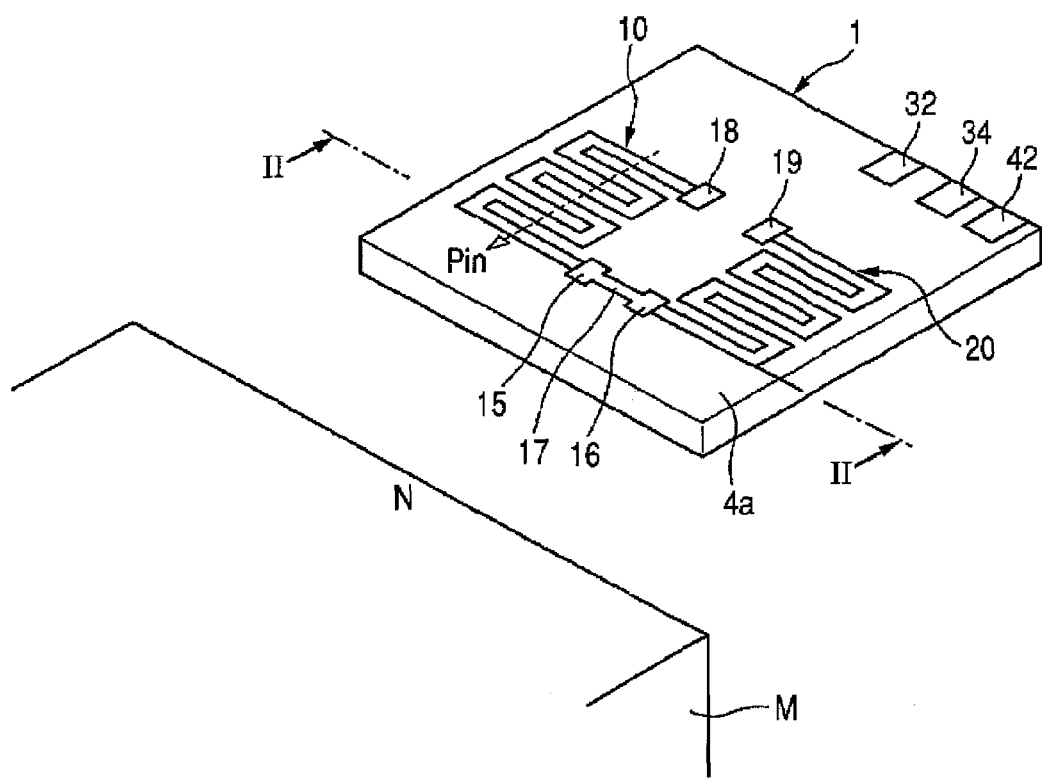
FIG. 1 is a perspective view illustrating a magnetic detection device according to a first embodiment.
Figure 2:
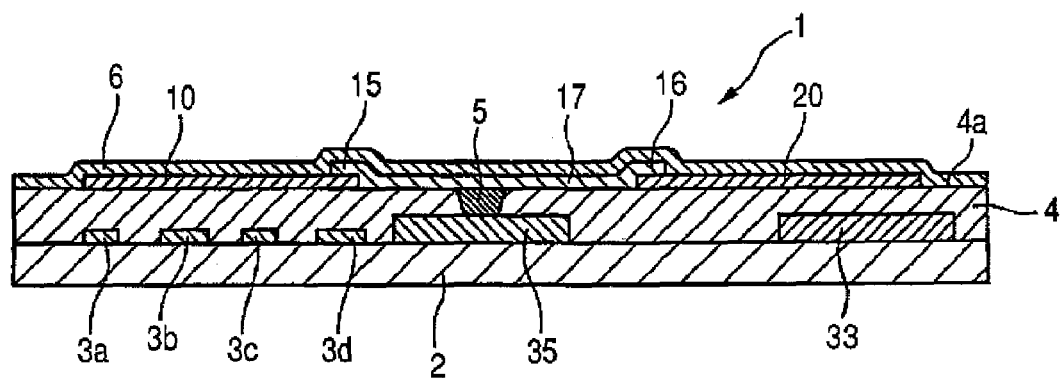
FIG. 2 is a longitudinal sectional view illustrating the magnetic detection device according to the first embodiment taken along Line II-II shown in FIG. 1.
Figure 4:
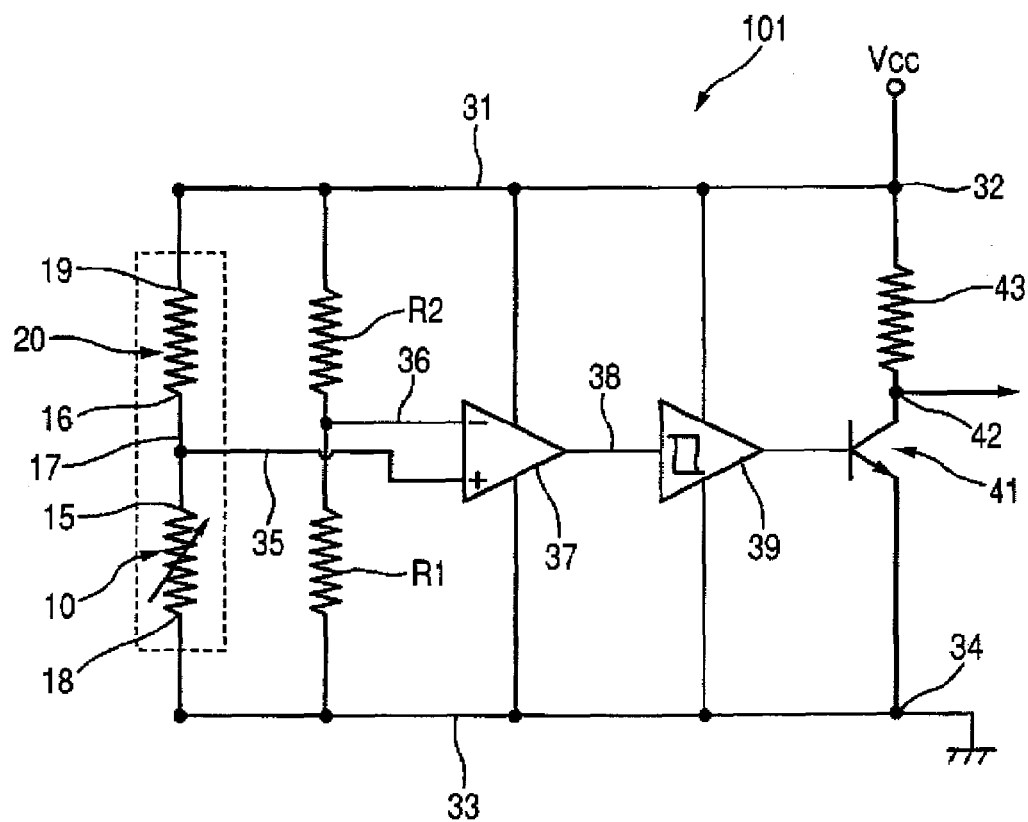
FIG. 4 is a diagram illustrating a circuit configuration of the magnetic detection device according to the first embodiment.
Figure 5A:
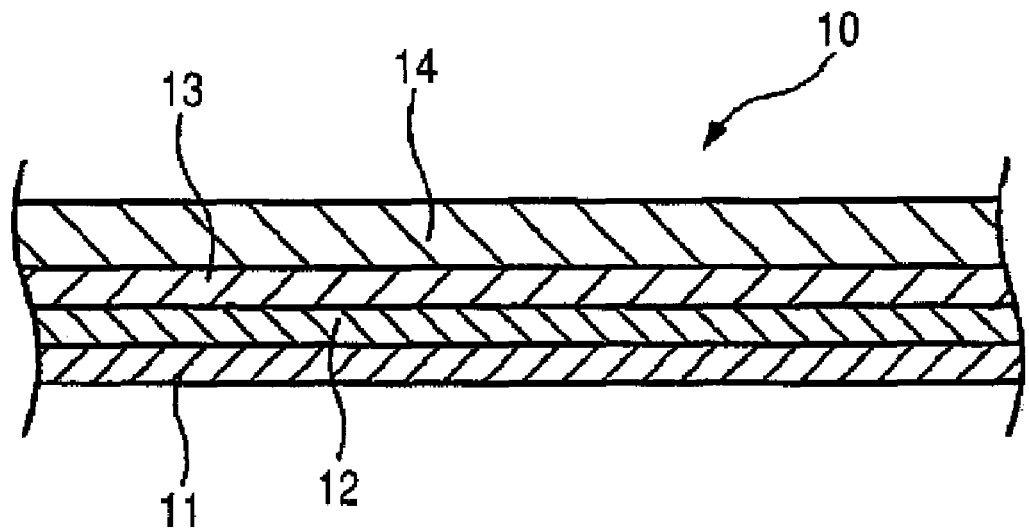
FIGS. 5A and 5B are enlarged sectional views illustrating a magnetic detection element and a fixed resistance element, respectively.
Figure 5B:
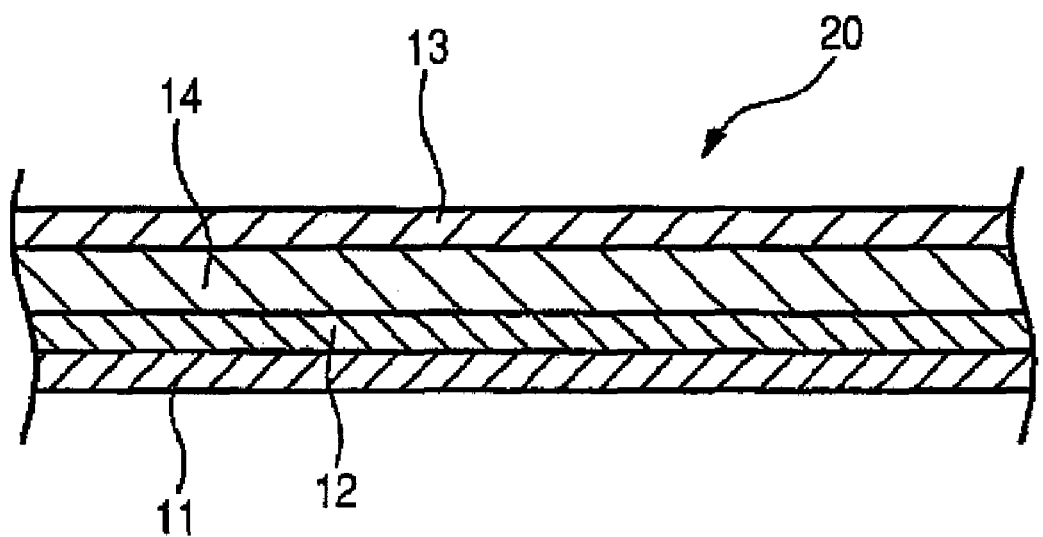

FIG. 1 is a perspective view illustrating a magnetic detection device according to a first embodiment. FIG. 2 is a longitudinal sectional view illustrating the magnetic detection device shown in FIG. 1 taken along Line II-II. FIG. 4 is a circuit configuration diagram illustrating the magnetic detection device. FIG. 5A is an enlarged sectional view illustrating a film formation of a magnetic detection element. FIG. 5B is an enlarged sectional view illustrating a film formation of a fixed resistance element.

The magnetic detection device 1 shown in FIG. 1 is a unified IC package of a magnetic detection element 10, a fixed resistance element 20, and a detection circuit and is formed small and thin. The magnetic detection device 1 works due to magneto-resistance effect (AMR effect), a giant magneto-resistance effect (GMR effect) and tunnel magneto-resistance effect (TMR effect). The magnetic detection device 1 can obtain an ON output of a pulse shape when a magnetic field generating member, such as a magnet M, approaches. For example, the magnetic detection device 1 is built in a core portion on which key switches are arranged in a foldable cellular phone. The magnet M is mounted on a foldable portion having a display device, such as a liquid crystal device. When the core portion and the foldable portion are folded to contact with each other, the magnet M approaches the magnetic detection device 1, and then the magnetic detection device 1 detects an external magnetic field generated by the magnet M, thereby obtaining the ON output.

An arrangement position of the magnetic detection device 1 is not limited to the foldable cellular phone and may be mounted on, for example, a car to be used in a position detecting portion of a sheet, a detachment detecting portion of a safety belt, or the like. Alternatively, it is possible to be used for checking the phase of a rotation or the number of rotations of a magnet by changing a circuit configuration.

According to the magnetic detection device 1 of the embodiment, the device is constituted as shown in FIG. 4 to obtain the ON output by detecting the magnetic field generated from the magnet M or the like.

As shown in FIG. 4, a magnetic detection element 10 and a fixed resistance element 20 are mounted on the magnetic detection device 1. An electric resistance of the magnetic detection element 10 varies by using a magneto-resistance effect. The fixed resistance element 20 has basically the same electric resistance and temperature characteristic as the magnetic detection element 10. Additionally, the electric resistance substantially does not vary with the magnitude of an external magnetic field to which the magnetic detection element 10 reacts.

The magnetic detection element 10 detects the external magnetic field by using a giant magneto-resistance effect (a GMR effect). As shown in FIG. 5A, from the lower surface of the magnetic detection element 10, the magnetic detection element 10 is sequentially laminated in the order of an antiferromagnetic layer 11 formed of an Ir—Mn alloy (an iridium-manganese alloy), a Pt—Mn alloy (a platinum-manganese alloy), or the like, and a fixed magnetic layer 12 formed of a soft magnetic material such as a Co—Fe alloy (a cobalt-iron alloy) or a Ni—Fe alloy (a nickel-iron alloy). On the fixed magnetic layer 12, it is sequentially laminated in order of a non-magnetic intermediate layer 13 formed of such as Cu (a copper) and the Ni—Fe alloy (the nickel-iron alloy), and a detection magnetic layer (a free magnetic layer) 14 formed of the soft magnetic material such as the Co—Fe alloy (the cobalt-iron alloy) or the Ni—Fe alloy (the nickel-iron alloy).

As shown in FIG. 1, a shape of a plane of the magnetic detection element 10 is formed in a meander pattern, so its basic electric resistance increases. With an antiferromagnetic coupling of the antiferromagnetic layer 11 and the fixed magnetic layer 12, a magnetization direction of the fixed magnetic layer 12 is fixed perpendicular to a Pin direction shown in FIG. 1, that is, a length direction of the magnetic detection element 10. Accordingly, as shown in FIG. 1, when an N pole of the magnet M approaches, a magnetization direction of a detection magnetic layer 14 becomes opposite to the Pin direction and an electric resistance of the magnetic detection element 10 is maximized. In addition, when the magnet M withdraws farther and an external magnetization acting on the detecting magnetic layer 14 disappears, the resistance of the magnetic detection element 10 is minimized.

Alternatively, when the Pin direction, which is the fixed magnetization direction of the fixed magnetic layer 12, is set opposite to the direction shown in FIG. 1 as the N pole of the magnet M approaches, the electric resistance of the magnetic detection element 10 is minimized, and when the magnet M withdraws farther, the electric resistance is maximized.

As shown in FIG. 53B, the fixed resistance element 20 is sequentially laminated from the lower surface in the order of the antiferromagnetic layer 11 and a fixed magnetic layer 12. The magnetization direction of the fixed magnetic layer 12 is fixed to a Pin direction same as the fixed magnetic layer 12 of the magnetic detection element 10. However, the fixed resistance element 20 is sequentially laminated in the order of the detection magnetic layer 14 and the non-magnetic intermediate layer 13 on the fixed magnetic layer 12. The laminated order of the detection magnetic layer 14 and the non-magnetic intermediate layer 13 is opposite to the magnetic detection element 10. Because the fixed resistance element 20 is laminated from the bottom in the order of the fixed magnetic layer 12, the detection magnetic layer 14, and the non-magnetic intermediate layer 13, the electric resistance substantially does not vary. For example, the electrical resistance substantially does not vary even when the external magnetic field to which the magnetic detection element 10 reacts, i.e., the external magnetic field having the magnitude that varies the resistance of the magnetic detection element 10, acts.

However, the fixed resistance element 20 constituted of the antiferromagnetic layer 11, the fixed magnetic layer 12, the detection magnetic layer 14, and the non-magnetic intermediate layer 13 has the same material and thickness as each layer constituting the magnetic detection element 10. Additionally, as shown in FIG. 1, the fixed resistance element 20 is two-dimensionally formed in the meander pattern same as the magnetic detection element 10. Therefore, the fixed resistance element 20 has the same electric resistance as the magnetic detection element 10 and its temperature characteristic is also similar. In addition, the magnetic detection element 10 and the fixed resistance element 20 are disposed on the same surface, in which both elements 10 and 20 are disposed in the same temperature condition.

Because the magnetic detection element 10 and the fixed resistance element 20 are formed in a meander type, each resistance can be increased high, thereby reducing a current consumption. In addition, when the external magnetic field acts, it is possible to obtain an adequate central potential.

As shown in FIG. 1, an electrode layer 15 formed of a low-resistance material is formed at one end of the magnetic detection element 10 and an electrode layer 18 formed of the low-resistance material is similarly formed at the other end thereof. An electrode layer 16 formed of the low-resistance material is formed at one end of the fixed resistance element 20 and an electrode layer 19 formed of the low-resistance material is similarly formed at the other end thereof. The electrode layer 15 of the magnetic detection element 10 and the electrode layer 16 of the fixed resistance element 20 are connected to a lead layer 17, and the magnetic detection element 10 and the fixed resistance element 20 are connected to each other in series. The electrode and lead layers are mainly formed of a low-resistance material, such as gold, silver, copper, or the like. For example, the electrode and lead layers are sequentially laminated in order of a chrome, a copper, and a chrome.

In the circuit configuration shown in FIG. 4, reference resistance elements R1 and R2 are connected to each other in series. A bridge circuit is formed by connecting a series group of the magnetic detection element 10 and the fixed resistance element 20 to a series group of the reference resistance elements R1 and R2 in parallel. As shown in FIG. 1, one end of both series groups of the bridge circuit is connected to an electrical power supply pad 32 exposed on the magnetic detection device 1 via a electrical power supply interconnection layer 31. The other end of both series groups is connected to a ground pad 34 exposed on the magnetic detection device 1 via a ground interconnection layer 33. In the magnetic detection device 1, because an electrical power supply voltage Vcc is applied to the electrical power supply pad 32, the ground pad 34 is set to a ground potential.

As shown in FIG. 4, the lead layer 17 connecting the magnetic detection element 10 to the fixed resistance element 20 in series is connected to a central interconnection layer 35. The central interconnection layer 35 is connected to a + (positive) input portion of a differential amplifier 37. A connection point of the reference resistances R1 and R2 is connected to a central interconnection layer 36. The central interconnection layer 36 is connected to a − (negative) input portion of the differential amplifier 37. As shown in FIG. 1, when the resistance of the magnetic detection element 10 increases as the N pole of the magnet M approaches the magnetic detection device 1, a central potential of the central interconnection layer 35 increases. When the central potential of the central interconnection layer 35 increases more than that of the central interconnection layer 36, which is a reference voltage, a potential of a differential output interconnection layer 38 connected to an output portion of the differential amplifier 37 increases. The output becomes a rectangular wave of which a noise is removed via a comparator 39, such as a schmitt trigger type, and an output potential determined by an output transistor 41 and an output resistance 43 is applied to an output pad 42 shown in FIG. 1.

In the magnetic detection device 1, when the resistance of the magnetic detection device 10 increases up to a certain degree as the N pole of the magnet M approaches, an ON output of a rectangular wave is obtained from the output pad 42.

According to the embodiment, the detection circuit is formed of a circuit element other than the magnetic detection element 10 of the circuit configuration shown in FIG. 4.

Next, a laminated structure and a fabricating method of the magnetic detection device 1 will be described with reference to FIGS. 1 and 2.

A plurality of the magnetic detection devices 1 are formed on a substrate 2 made of a silicon (Si) and then each magnetic detection device 1 is divided together with the substrate 2 by a dicing process. Hereinafter, a structure for only one magnetic detection device 1 will be described.

An underlying layer made of a silicon dioxide ($SiO_2$) is formed on the substrate 2 with a predetermined thickness (not shown). The active element and the interconnection layer constituting the differential amplifier 37, the active element layer and the interconnection layer constituting the comparator 39, the active element constituting the output transistor 41, and the like are formed on the underlying layer by a thin film process. A forming of the active element layer and the interconnection layer is performed by such as a CVD process, a sputtering process, and a plating process. Additionally, each active element together with the reference resistance elements R1 and R2 and the output resistance 43 are formed on a surface of the underlying layer. Each active element, resistance elements, and the like are two-dimensionally arranged on the surface of the underlying layer and are formed. Additionally, a portion of the active elements or the resistance elements may be laminated and is formed. As shown in FIG. 2, the active elements or the resistance elements are indicated as circuit elements 3a, 3b, 3c, and 3d.

In addition, the interconnection layers 31, 33, 35, 36, and 38 are formed on the surface of the underlying layer by the sputtering or plating processes, respectively. The interconnection layers 31, 33, 35, 36, and 38 are formed of the low-resistance material, for example, an aluminum. As show in FIG. 2, the interconnection layers 31, 33, 35, 36, and 38 of the magnetic detection device 1 formed with a width of about 1.0 μm or more and a thickness of about 3 μm or less. By forming the interconnection layers with a wide width and a thick thickness, it is possible to cope with high current. Furthermore, because reliability such as for a temperature characteristic is enhanced, it is possible to satisfy a standard condition even when the device is used in, but not limited to, a portable device, such as a cellular phone, or an in-car product.

After the underlying layer, the circuit elements 3a, 3b, 3c, and 3d, and the interconnection layers 31, 33, 35, 36, and 38 are formed on the substrate 2 and an insulating layer 4 that is a passivation layer is formed above thereof. The insulating layer 4 is formed by a CVD process or the sputtering process. After forming the insulating layer 4, a surface of the insulating layer 4 is polished to be a flat surface 4a by a CMP method. The insulating layer 4 is made of, for example, a silicon nitride ($Si_3N_4$) and the like.

Although the flat surface 4a may be partially formed on an area disposing the magnetic detection element 10 and the fixed resistance element 20, the flat surface 4a is formed on a total area of the surface of the insulating layer 4 in the embodiment. Plural sets of the circuit elements 3a, 3b, 3c, and 3d and the interconnection layers 31, 33, 35, 36, and 38 are formed on the large substrate 2 to form a plurality of the magnetic detection devices 1, and then all of them are covered with the insulating layer 4. A plurality of the flat surfaces 4a of the magnetic detection device 1 are able to be formed at the same time by forming the flat surface 4a in terms of polishing the total area of the surface by a CMP method and the like. It is possible to form the magnetic detection element 10 and the fixed resistance element 20 of a meander pattern, which relatively needs a wide disposal area.

When the flat surface 4a is formed by forming the insulating layer 4, the laminated body thereof can be treated as one substrate. Even when the laminated body is exposed to the atmosphere, it is possible to prevent the laminated body from oxidizing because the circuit elements 3a, 3b, 3c, and 3d and the interconnection layers 31, 33, 35, 36, and 38 are covered with the insulating layer 4.

The magnetic detecting element 10 of the laminated body shown in FIG. 5A is formed on the flat surface 4a, that is, a surface of the laminated body by the CVD process, the sputtering process, or the plating process. In this process, it is subsequently laminated in order of the antiferromagnetic layer 11, the fixed magnetic layer 12, the non-magnetic intermediate layer 13, and the detection magnetic layer 14 on a total surface of the flat surface 4a. Then, a resist layer is formed on the surface thereof. After a patterning is performed on the resist layer by covering a necessary portion with the resist layer, each layer of a portion which is not covered with the resist layer is removed by an ion-milling process, whereby the magnetic detection element 10 of a meander pattern is formed on the flat surface 4a as shown in FIG. 1.

The magnetic detection element 10 is covered with the resist layer. In the other portion, it is laminated from the bottom of the total surface of the flat surface 4a in order of the antiferromagnetic layer 11, the fixed magnetic layer 12, the detection magnetic layer 14, and the non-magnetic intermediate layer 13 as shown in FIG. 5B. The thickness of each of theses layers 11, 12, 14, and 13 is set to be equal to that of each of layers 11, 12, 13, and 14 of the magnetic detection element 10.

After each of the layers 11, 12, 14, and 13 is laminated, the resist layer is formed on thereof. The patterning is performed on the resist layer, and then each layer of the portion which is not covered with the resist layer is removed by the ion-milling process, so that the fixed resistance element 20 of the meander pattern can be formed as shown in FIG. 1. Furthermore, the resist layer covering the magnetic detection element 10 and the fixed resistance element 20 is removed by a lift-off process.

When the magnetic field of the Pin direction as shown in FIG. 1 acts so as to anneal a laminated body that is formed by the above processes, the magnetization direction of the fixed magnetic layer 12 of the magnetic detection element 10 is fixed to the Pin direction. At this time, the magnetization direction of the fixed magnetic layer 12 of the fixed resistance element 20 is together fixed. However, as described above, even when the external magnetic field to which the magnetic detection element 10 reacts is applied, the electric resistance of the fixed resistance element 20 does not vary substantially because it is sequentially laminated in the order of the fixed magnetic layer 12, the detection magnetic layer 14, and the non-magnetic intermediate layer 13.

The resist layer is formed on the surface of the flat surface 4a, and the patterning is performed on the resist layer. The electrode layers 15, 16, 18, and 19, the lead layer 17, and the pads 32, 34, and 42, mainly formed of the low-resistance material, are formed by the plating process on a portion in which the resist layer is removed. Each of these layers is mainly formed of the low-resistance material, such as gold, silver, or copper. For example, the laminated body is sequentially laminated in the order of chrome, copper, and chrome.

As shown in FIG. 2, the lead layer 17 connecting the magnetic detection element 10 to the fixed resistance element 20 in series is formed above the central interconnection layer 35 shown in FIG. 4. Additionally, as shown in FIG. 2, a bump 5 penetrating the insulating layer 4 is formed on the central interconnection layer 35 before forming the lead layer 17 on the flat surface 4a. The lead layer 17 and the central interconnection layer 35 are electrically connected to each other via the bump 5. The bump 5 is formed of a material such as gold, silver, copper, or aluminum.

An electrode layer 18 formed on an end of the magnetic detection element 10 is formed just above the electrical power supply interconnection layer 31 formed on the surface of the substrate 2. The electrode layer 18 and the electrical power supply interconnection layer disposed above and below thereof are connected to each other via the bump. An electrode layer 19 formed on an end of the fixed resistance element 20 is formed just above the ground interconnection layer 33 formed on the substrate 2. The electrode and ground interconnection layers 19 and 33 disposed above and below thereof are connected to each other via the bump. Additionally, the electrical power supply interconnection layer 31 is disposed below the electrical power supply pad 32, the ground interconnection layer 33 is disposed below the ground pad 34, and the interconnection layer is disposed below the output pad 42. The electrical power supply pad 32, the ground pad 34, and the output pad 42 are connected to the interconnection layer disposed below thereof via the bump.

The interconnection layer is formed below the electrode layers 15, 16, 18, and 19, the lead layer 17, and each of the pads 32, 34, and 42 on the substrate 2, so that the electrode layer and the interconnection layer, the lead layer and the interconnection layer, and the pad and the interconnection layer are electrically connected via the bump penetrating the upper and lower sides of the insulating layer 4, respectively. Consequently, it is possible to form the magnetic detection device 1 in a small area.

Additionally, as shown in FIG. 2, the magnetic detection element 10, the fixed resistance element 20, the electrode layers 15, 16, 18, and 19, and the lead layer 17 are covered with the passivation layer 6. The passivation layer 6 is formed of an insulating material such as an alumina ($Al_2O_3$) and a silicon dioxide ($SiO_2$) by the sputtering process. Also, the electrical power supply pad 32, the ground pad 34, and the output pad 42 shown in FIG. 1 are not covered with the passivation layer 6, and these pads are exposed.

After each layer is formed, the substrate 2 is divided by a dicing process, so that each individual magnetic detection device 1 shown in FIG. 1 is obtained.

In the above-mentioned fabricating method, the circuit elements 3a, 3b, 3c, and 3d and each of the interconnection layers 31, 33, 35, 36, and 38 are formed on the substrate 2, and then the insulating layer 4 is formed on thereof. Because the total area of the surface of the insulating layer 4 is the flat surface 4a, this laminated body is treated as the substrate, so that the magnetic detection element 10, the fixed resistance element 20, the electrode layers 15, 16, 18, and 19, the lead layer 17, and each of the pads 32, 34, and 42 can be formed on the flat surface 4a by the thin film process.

Figure 3:
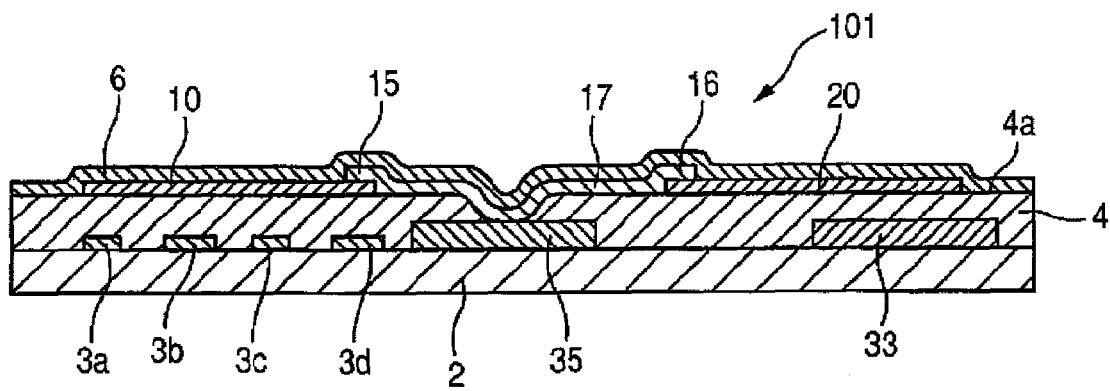
FIG. 3 is a longitudinal sectional view illustrating a magnetic detection device according to a second embodiment.

FIG. 3 is a longitudinal sectional view illustrating a magnetic detection device 101 according to a second embodiment. The same portions of configuration elements of the magnetic detection device 101 as the magnetic detection device 1 according to the first embodiment are marked with the same numeral, and the description of the same portions is omitted.

In the magnetic detection device 101 shown in FIG. 3, the bump 5 is not formed, and a lead layer 17 and a central interconnection layer 35 disposed below the lead layer 17 are directly connected to each other. In a fabricating process of the magnetic detection device 101, when an insulating layer 4 is formed, the insulating layer 4 is punched by an ion-milling process before and after a flat-surface 4a is formed, and then a lead layer 17 is formed by the plating and the like, thereby directly connecting the lead layer 17 to the central interconnection layer 35. In addition, the connection of other electrode layers 18 and 19 to the interconnection layer, and each of the pads 32, 34, and 42 to the interconnection layer are performed in the same way as above. Furthermore, the connection method using the bump 5 and the above-mentioned direct connection method can be used together.

Figure 6:
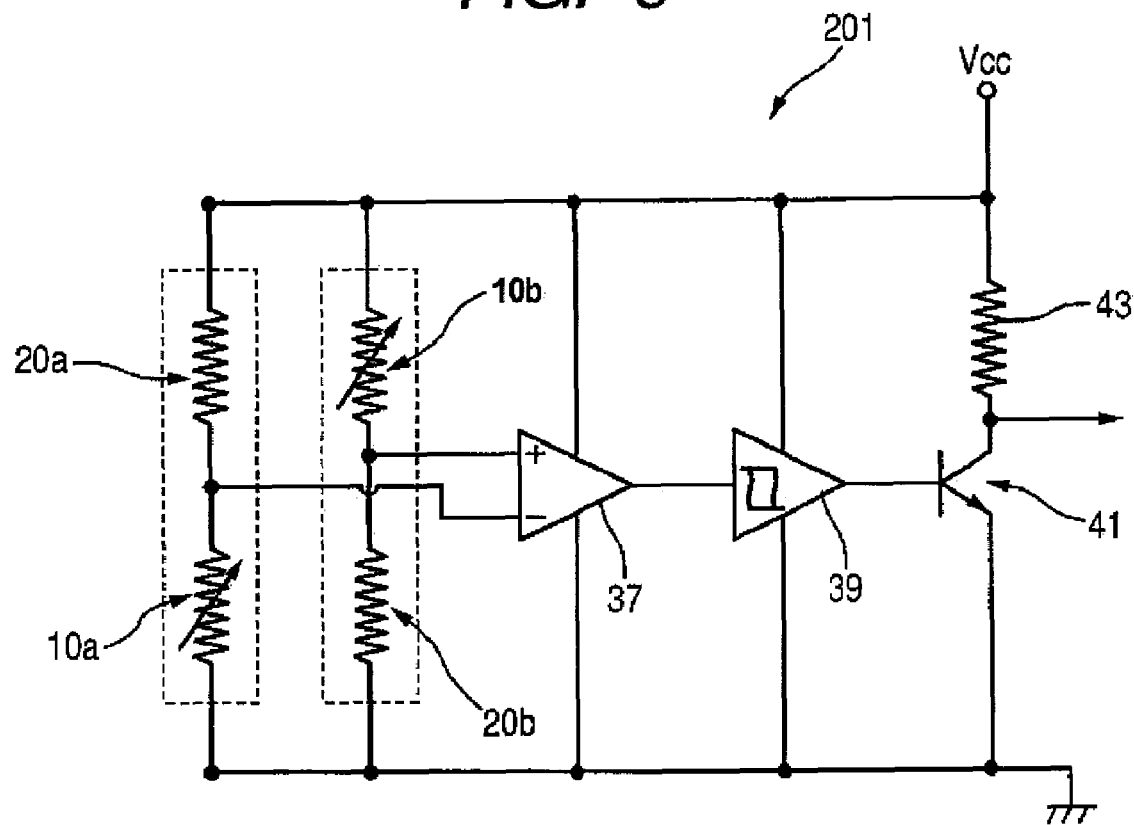
FIG. 6 is a diagram illustrating a circuit configuration of a magnetic detection device according to a third embodiment.

A circuit configuration of a magnetic detection device 201 according to a third embodiment is described in FIG. 6. In the magnetic detection device 201, a pair of magnetic detection elements 10a and 10b having the same laminated structure as shown in FIG. 5A, and a pair of fixed resistance elements 20a and 20b having the same laminated structure as shown in FIG. 5B are used. The magnetic detection elements 10a and 10b and the fixed resistance elements 20a and 20b are formed on a flat surface 4a of an insulating layer 4. The magnetic detection elements 10a and 10b are disposed so that those of the Pin directions may have the same direction on the flat surface 4a.

The magnetic detection element 10a and the fixed resistance element 20a are connected to each other in series. The magnetic detection element 10b and the fixed resistance element 20b are connected to each other in series. A bridge circuit is formed. A central potential of the magnetic detection element 10a and the fixed resistance element 20a is applied to a − (negative) input portion of a differential amplifier 37, and a central potential of the magnetic detection element 10b and the fixed resistance element 20b is applied to a + (positive) input portion of the differential amplifier 37.

Accordingly, when the resistance of the magnetic detection elements 10a and 10b varies, double output voltage is obtained from the differential amplifier 37 more than that of the first embodiment.

Electrode layers of the magnetic detection elements 10a and 10b and the fixed resistance elements 20a and 20b or a lead layer, which directly connects the electrode layers to each other, are electrically connected to the interconnection layer disposed below the lead layer via the bump 5 as shown in FIG. 2 or directly electrically connected to the interconnection layer as shown in FIG. 3.

According to the third embodiment shown in FIG. 6, a detection circuit is formed by a circuit element other than the magnetic detection elements 10a and 10b.

In the first embodiment shown in FIGS. 1 and 2, the magnetic detection element 10 and the fixed resistance element 20 are formed on the same flat surface 4a. In the third embodiment shown in FIG. 6, the magnetic detection elements 10a and 10b, and the fixed resistance elements 20a and 20b are formed on the same flat surface 4a. Consequently, in any of the embodiments, the magnetic detection elements and the fixed resistance elements are placed under the same temperature condition and the magnetic detection element and the fixed resistance element have the same temperature characteristic. Accordingly, even when the ambient temperature varies, a variation of the central potential decreases, thereby detecting a magnetic field with high precision all the time.

The features described above provide a magnetic detection device capable of integrating a magnetic detection element and a detection circuit in a small area. Also, a fabricating method is provided and capable of efficiently fabricating the magnetic detection device having the magnetic detection element and the detection circuit in a small size.

The magnetic detection element is disposed on the insulating layer covering the active element constituting a detection circuit, thereby forming an integrated device in a small area. A surface of the insulating layer is planarized so the magnetic detection element of a structure of multi-layered film is formed on the flat surface, thereby easily forming the magnetic detection element. Therefore, a dimensional precision of the magnetic detection element can be achieved with high precision, thereby obtaining the magnetic detection element with high detection precision.

The magnetic detection element is able to detect an external magnetic field by using a magneto-resistance effect (an AMR effect), a giant magneto-resistance effect (a GMR effect), or a tunnel magneto-resistance effect (a TMR effect).

Because the magnetic detection element and the fixed resistance element are formed on the flat surface of the insulating layer, both the magnetic detection element and the fixed resistance element can be formed with high precision. In addition, the magnetic detection element and the fixed resistance element can be disposed in the same condition, thereby enhancing an output precision of a central voltage of both elements.

Because the interconnection layer of the detection circuit and the lead layer on the surface of the interconnection layer overlap each other and electrically connect to each other above and below, the device can be formed in a small area rather than expanding the interconnection and lead layers to be two-dimensionally disposed.

It is possible to decrease the number of fabricating processes by forming the active element together with the reference resistance element, other than the magnetic detection element, or the reference resistance element, other than the magnetic detection element, and the fixed resistance element on the substrate during a fabricating process of a semiconductor.

In the method of fabricating the magnetic detection device, the detection circuit is formed on the substrate and covered with an insulating layer. Additionally, a surface of the insulating layer is planarized and then the magnetic detection element is formed on the flat surface. Accordingly, a laminated body laminated sequentially from the substrate to the insulating layer is treated same as the substrate. Therefore, the magnetic detection element can be formed on the flat surface in terms of a thin film laminating process, thereby excellently producing in large quantities.

In the method of fabricating the magnetic detection device, a surface of the insulating layer is planarized after forming the insulating layer of the substrate and the detection circuit. Accordingly, a laminated body of the substrate, the detection circuit, and the insulating layer is treated same as the substrate. The magnetic detection element or the fixed resistance element can be formed on the flat surface in terms of a thin film laminating process, thereby suitably producing in large quantities.

According to the above-mentioned configuration, it is possible to apply the features mentioned above to a small device because a small-area integrated chip can be formed, and thus it is easy to dispose other components or a circuit around the magnetic detection device.

What is claimed is:

1. A magnetic detection device comprising:
a magnetic detection element with a multi-layered film structure in which an electric resistance varies with an external magnetic field using a magneto-resistance effect; and
a detection circuit detecting a variation in electric resistance of the magnetic detection element, wherein an active element and an interconnection layer included in the detection circuit are disposed on a substrate, at least a portion on the surface of an insulating layer covering the active element and the interconnection layer is planarized into a flat surface, and the magnetic detection element is disposed on the flat surface, and wherein the interconnection layer on the substrate and the magnetic detection element on the insulating layer are electrically connected to each other, wherein an electrode layer of the magnetic detection element or a lead layer extending from the electrode layer that is disposed on the flat surface is disposed above the interconnection layer, the electrode layer or the lead layer and the interconnection layer, which are disposed above and below each other, are electrically connected to each other.

2. The magnetic detection device according to claim 1, further comprising a fixed resistance element that is of the same film as the magnetic detection element and of which an electric resistance does not vary with the external magnetic field, wherein the fixed resistance element and the magnetic detection element are connected to each other in series and disposed on the flat surface, and a connection point between the magnetic detection element and the fixed resistance element is electrically connected to the interconnection layer.

3. The magnetic detection device according to claim 1, further comprising a bridge circuit having the magnetic detection element, wherein a reference resistance element included in the bridge circuit is disposed on the substrate together with the active element.

4. A method of fabricating a magnetic detection device that includes a magnetic detection element with a multi-layered film structure of which an electric resistance varies with an external magnetic field using a magneto-resistance effect, and a detection circuit that detects a variation in electric resistance of the magnetic detection element, the method comprising the steps of:
forming an active element and an interconnection layer included in the detection circuit on a substrate;
planarizing at least a portion of the surface of an insulating layer covering the active element and the interconnection layer into a flat surface;
forming the magnetic detection element on the flat surface; and
electrically connecting the interconnection layer on the substrate to the magnetic detection element on the insulating layer, wherein an electrode layer of the magnetic detection element is formed on the flat surface, the electrode layer or a lead layer extending from the electrode layer is formed just above the interconnection layer, and the electrode layer or the lead layer and the interconnection layer, which are disposed above and below each other, are electrically connected to each other.

5. The method according to claim 4, wherein a fixed resistance element that is of the same film as the magnetic detection element and of which electric resistance does not vary with the external magnetic field is formed so as to be electrically connected in series to the magnetic detection element on the flat surface, and a connection point between the magnetic detection element and the fixed resistance element is electrically connected to the interconnection layer.

6. The method according to claim 4, wherein a bridge circuit having the magnetic detection element is formed and a reference resistance element included in the bridge circuit is formed on the substrate together with the active element.

7. A magnetic detection device comprising:
a magnetic detection element with two ends, the magnetic detection element comprised of a multi-layered film structure in which an electric resistance varies with an external magnetic field using a magneto-resistance effect;
a fixed resistance element coupled to one end of the magnetic detection element; and
a detection circuit detecting a variation in electric resistance of the magnetic detection element, wherein an active element and an interconnection layer included in the detection circuit are disposed on a substrate, at least a portion on the surface of an insulating layer covering the active element and the interconnection layer is planarized into a flat surface, and the magnetic detection element and the fixed resistance element are disposed on the flat surface, and wherein the interconnection layer on the substrate and the magnetic detection element on the insulating layer are electrically connected to each other.

8. A method of fabricating a magnetic detection device that includes a magnetic detection element with a multi-layered film structure of which an electric resistance varies with an external magnetic field using a magneto-resistance effect, and a detection circuit that detects a variation in electric resistance of the magnetic detection element, the method comprising the steps of:
forming an active element and an interconnection layer included in the detection circuit on a substrate;
planarizing at least a portion of the surface of an insulating layer covering the active element and the interconnection layer into a flat surface;
forming the magnetic detection element on the flat surface;
forming a fixed resistance element on the flat surface and coupling the fixed resistance element to the magnetic detection element; and
electrically connecting the interconnection layer on the substrate to the magnetic detection element on the insulating layer.

* * * * *